United States Patent [19]

Thompson

[11] Patent Number: 4,499,434

[45] Date of Patent: Feb. 12, 1985

[54] PLL PHASE ERROR ALARM RELATED TO ASSOCIATED RECEIVER

[75] Inventor: William J. Thompson, Richardson, Tex.

[73] Assignee: Rockwell International Corporation, El Segundo, Calif.

[21] Appl. No.: 399,535

[22] Filed: Jul. 19, 1982

[51] Int. Cl.³ .......................... H03L 7/08; H03B 1/00
[52] U.S. Cl. ........................................ 331/17; 331/25; 331/64; 331/DIG. 2; 455/9; 455/260
[58] Field of Search ............... 331/17, 25, 64, DIG. 2; 455/8, 9, 260

[56] References Cited

U.S. PATENT DOCUMENTS 4,317,223  2/1982  Farmer, Jr. .................. 331/64 X

FOREIGN PATENT DOCUMENTS 0130862 10/1979 Japan .................................. 331/17
0025206  2/1980 Japan ........................... 331/DIG. 2

Primary Examiner—Eugene R. LaRoche
Assistant Examiner—D. C. Mis
Attorney, Agent, or Firm—Richard A. Bachand; V. Lawrence Sewell; H. Fredrick Hamann

[57] ABSTRACT

An alarm circuit operatively associated with a phase-locked loop provides an error indication when the phases of the referenced signal and voltage controlled oscillator signal lose synchronization for times less than one millisecond. The alarm circuit includes an amplifier connected to receive the phase detector error signal, and an impedance connected to conduct the phase detector error signal to the amplifier. The impedance and amplifier have a frequency response corresponding to a frequency response of an associated receiver circuit, so that short duration deviations in the reference signal frequency which the receiver circuit cannot track produce an error indication and long duration deviations which can be tracked by the receiver circuit do not produce an error indication.

7 Claims, 6 Drawing Figures

PLL PHASE ERROR ALARM RELATED TO ASSOCIATED RECEIVER

BACKGROUND OF THE INVENTION

1. Field of the Invention

This invention relates to improvements in phase modulated communications systems, and, more particularly to improvements in error alarms used in conjunction with phase locked signal sources for use in phase modulated communications systems.

2. Description of the Prior Art

In microwave telecommunications, the transmission of digital voice signals is becoming of great interest. Typically, digital microwave telecommunications are achieved with a phase modulated signal which includes a number of voice channels multiplexed into a single channel for transmission over the distances required. Upon reception of the signal, the various individual signals are demultiplexed and distributed to their appropriate destinations. In such data communications, however, precision of the appropriate phase modulation must be flawlessly maintained in order that the signals can be properly detected and decoded at various points along the distribution route.

As background for understanding the present invention, the mechanics of a phase modulated system are described. In a typical phase modulated signal, the phase is changed with reference to a carrier frequency, the change in phase being detected as the data. In order to determine the phase change, most phase modulation signal receivers include a carrier recovery loop which generates a reference carrier signal from the received signal and against which changes in phase in the received signal are compared. In a four phase system, for example, if the phase changes of the carrier are 0, 90, 180, and 270 degrees, each of the four phase angles indicates a particular data state or data state change, as is well known in the art. Because of variations throughout the transmission, however, the actual phase states determined by the receiver might not coincide precisely with one of the four phase coordinates. For example, a phase state intended to correspond to a 90 degrees phase shift may in fact be detected as only an 85 degree phase change. This is not important to most receivers, since typical phase modulation signal receivers automatically align a detected phase change with the closest phase pole. Thus, for example, in a four phase system, so long as a phase change is within plus or minus 45 degrees of the intended phase, the receiver will automatically lock (detect, decode, or attribute) the data onto the appropriate closest phase pole. It can be seen, however, that if the error exceeds 45 degrees, the data will be interpreted as being a different phase from that actually intended, and a data detection error will occur.

In many receivers, the change in the frequency of the reference carrier developed by the carrier recovery loop may be permitted to gradually drift or change without affecting the accuracy of the data detection process of the receiver. This is because a phase locked loop is typically provided in the receiver to follow the carrier recovery signal. Therefore, the main carrier can be allowed to drift, within limits, slowly within a certain range of carrier frequencies so long as the range is within the lock-in range of the phase locked loop of the receiver.

If, however, the transmitted carrier experiences an instantaneous or rapid phase jump, the frequency of the reference signal developed by the carrier recovery loop of the receiver will not fully or immediately follow the instantaneous jump. Therefore, data on the received signal will be compared against the relatively stable signal generated by the carrier recovery loop, it will be of different phase from that intended to be transmitted and will be erroneously detected.

In microwave technology, tuning is often affected by changes in mechanical parts of the system, such as thermally or mechanically induced change in length of a transmission line, the tuning of a microwave horn, or the like. The making or breaking of an electrical contact can occur by slow mechanical changes, but which can result in rapid electrical changes. Changes in the position of an effective contact point can easily shift the frequency of microwave oscillators. The transmission of the signal may therefore be flawed by a momentary "hit", or "glitch" caused by an unintended mechanical movement of one or more of the system parts. The phase of the transmitted or received signal may be therefore be undesirably affected. If the onset of the "hit" is more rapid than about one millisecond, the microwave receiver may be unable to distinguish the momentary unwanted "hit" caused phase change from a desired data phase change, thereby producing errors in the detected data. This is because the receiver carrier recovery phase lock loop has a limited ability to follow changes in the incoming carrier frequency. Data errors caused by this "hit" induced noise phase may disturb the receiver multiplex "framing system", in which case various received signals may be erroneously and chaotically distributed to the ultimate distribution points. It is therefore extremely important that the microwave frequency sources be maintained as steady as possible to achieve reliable communications. Because mechanical elements and other uncontrollable circuit parts are involved, total correction of the problem is not entirely possible, at present. This uncertainty requires that the errors at least be detected to warn of the existance of possible errors in the detected signal.

However, since microwave communications are conducted over a number of relay stations between a point of origin and a point of destination, when a phase "hit" or "glitch" occurs, because of the very fact that it is momentary, less then one millisecond, in many instances, although the diagnosis of the fact of the occurrence of a major error or "hit" is obvious because of the condition of the data, the localization of the error to a particular part or module is practically impossible without an effective alarm system.

In various microwave transmitters and receivers, a frequency source is generally employed by which the appropriate signal transmission or detection frequencies are established. Typical sources usually include a crystal controlled oscillator and a voltage controlled oscillator (VCO), which each generate frequencies for comparison by such as a mixer or the like to produce a phase error signal. The error signal in such systems, is fed back to the VCO to control its frequency, and thereby the phase difference between the VCO output and the crystal controlled oscillator output (phase being the integral of frequency) are maintained in phase lock. The output of the VCO typically is used to provide the microwave frequency desired for controlling the transmission or reception of the signal (in some cases after being multiplied by an appropriate factor).

In the past, the primary way for detecting the occurrence of an error in the source has been to monitor the voltage excursions applied to the input of the VCO from the comparing mixer. When the voltage approaches some predetermined limit beyond which the VCO cannot be properly phase-locked, an alarm is initiated. In such systems, however, the alarm is indicated only upon the occurrence of gross or long term errors; that is, when the controlled voltage has continued to its practical phase locking operating limit, an alarm is indicated, but an alarm is not indicated upon small, momentary interruptions on the order of less than one millisecond. Although the long-term interruptions are important, as described above, the momentary or instantaneous events can result in as much chaos in the demodulation of the signal as an out of lock phase locked loop.

It is desired, of course, to not only be informed of the occurrence of an error, but ultimately it is desirable to isolate the cause of the error so that the particular error causing conditions can be corrected. However, because the errors may be of such short duration, or are often times intermittent because of the mechanical conditions above described, or for some other reason, the isolation of the source of the errors is extremely difficult to identify. And, as above described, the alarm systems of the prior art which produce alarms only upon prolonged and large error producing events make the isolation and identification of the error producing part or system virtually impossible.

In general, the prior art source alarm circuits are basically phase lock alarms. The alarm operates when the VCO control voltage reaches or approaches the end of the usable phase lock range. However, it is possible for a "hit" induced phase error to occur that will put errors into the data detected at the receiver without causing the prior art phase lock alarm type circuits to alarm. Experience has shown that data errors can be induced in the receiver by such "hit" induced source phase errors which create only small and short duration change in the VCO control voltage. On the other hand, large changes in the VCO control voltage can occur without causing errors in the data detected by the receiver.

Commonly, prior art sources have a sweep circuit that causes the VCO control voltage to sweep over the full control range in the attempt to acquire phase lock. Some prior art alarm circuits detect (rectify) this large low frequency sweep signal and operate the alarm in response to its presence.

BRIEF DESCRIPTION OF THE INVENTION

In light of the above, it is, therefore, an object of the invention to provide a phase error alarm for a phase locked oscillator source.

It is another object of the invention to provide an alarm of the type described in which phase error alarm actuations are determined at the frequency source in view of a phase modulation susceptibility characteristic of an associated phase sensitive receiver.

It is another object of the invention to provide means for generating an alarm indicitive of momentary failures in source phase.

It is another object of the invention to provide an alarm system of the type described in which phase errors occurring in times less than about one millisecond produce human readable alarms.

It is another object of the invention to provide an alarm system which facilitates the isolation and identification of error producing circuitry, connections, and such.

It is another object of the invention to provide an alarm circuit which can separate significant and insignificant errors (significant errors being those that are likely to cause errors in the data detected by the receiver and insignificant errors being those that are unlikely to cause errors in the data detected by the receiver).

These and other objects, features, and advantages of the invention will become apparent to those skilled in the art from the following detailed description when read in conjunction with the accompanying drawings and appended claims.

In its broad aspect, the invention is intended for use with any source for providing a stable or constant frequency output, in a system employing phase modulation, to a receiver having a demodulation detector with known susceptibility to spurious phase errors, that is "phase modulation" of the source output. In such source, an alarm circuit is provided with a frequency response that makes the alarm circuit detect spurious phase modulation in the source output with a sensitivity similar to the susceptibility of the receiver detector to such spurious modulation. Therefore, the alarm circuit indicates an error when the phase modulation error of the source exceeds the susceptibility threshold characteristics of the receiver detector.

BRIEF DESCRIPTION OF THE DRAWING

The invention is illustrated in the accompanying drawing in which.

DETAILED DESCRIPTION OF THE PREFERRED EMBODIMENTS

Figure 1:
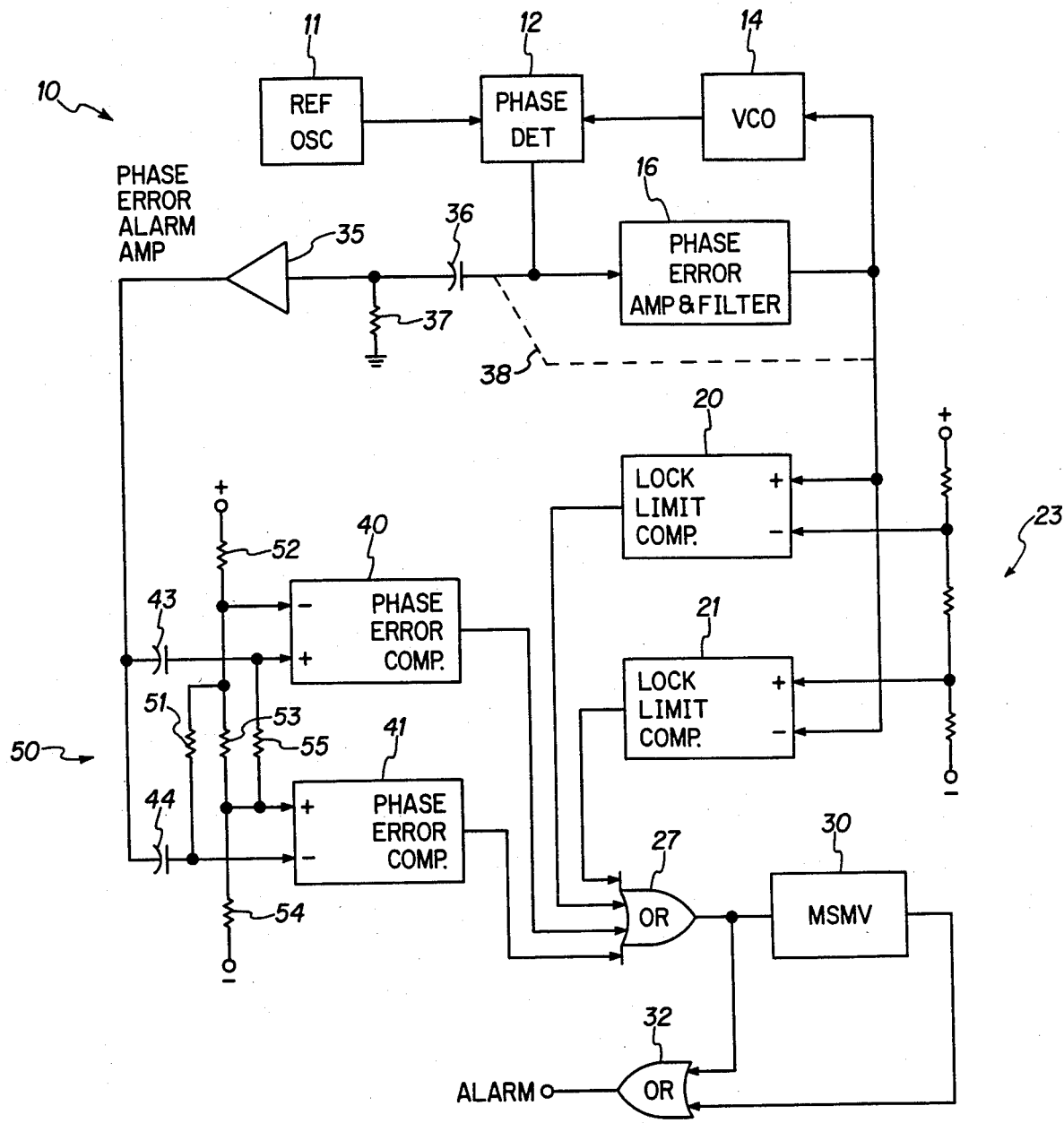
FIG. 1 is a block schematic diagram of the phase error alarm, in accordance with the invention.

The invention is illustrated in block diagram form in the circuit of FIG. 1 which includes circuitry for use in a phase modulated signal communications system (not shown), of a signal source of the type in which a reference oscillator 11, such as a crystal oscillator or the like, provided an input to a phase detector 12. A voltage controlled oscillator (VCO) 14 provides a second input to the phase detector 12 for comparison with the reference oscillator 11.

The phase error signal produced by the phase detector 12 is conducted to a phase error amplifier and filter 16, which produces a voltage signal output applied to the input of the VCO 14.

It can be seen that when the frequency of the VCO 14 shifts, the phase error (or phase difference) between the VCO and the reference oscillator begins to change or increase. This change produces a change or increase in the output of the phase error amplifier and filter 16, back to the VCO frequency control input, causing the VCO to change its frequency, thereby reducing the phase error. It can be further appreciated that if the system were to exhibit a perfect phase error correction, an infinite gain and frequency response from the phase control amplifier 16 would be required. Additionally, the phase/FM noise spectrum of the VCO would necessarily be the same as that of the reference oscillator. Such conditions, presently, cannot be practically achieved. Considerations of minimum phase and FM noise dictate that the loop bandwidth be finite. The bandwidth of the loop is chosen to achieve the best combination noise shaping characteristics of the reference oscillator 11 and VCO 14.

The output signal from the phase error amplifier and filter 16 is also applied to respective positive and negative inputs of lock limit comparators 20 and 21. A respective negative and positive reference voltage is applied to the lock limit comparators 20 and 21, produced, for example, by a voltage divider 23, as illustrated, to establish a voltage reference above and below which the associated lock limit comparators produces an output.

The respective outputs of the lock limit comparator circuits 20 and 21 are applied to two inputs of a quad-OR gate 27. The output of the OR gate 27 is directed to a control input of a monostable multivibrator 30, as well as to an input of a second OR gate 32, and the Q output of the monostable multivibrator is connected to another input of the OR gate 32. The output developed by the OR gate 32 constitutes the alarm signal, as indicated.

The circuit, as above described, except for the OR gates 27 and 32 and monostable multivibrator 30, is known in the art, and serves to provide an alarm signal when the voltage at the output of the phase error amplifier and filter 16 exceeds the predefined reference voltage established by the voltage divider 23 at the respective inputs of the lock limit comparators 20 and 21. (The OR gates 27 and 32 and monostable multivibrator are provided to produce an alarm with sufficient length to be readable by a human operator, as will be described below.) It will be appreciated that as mentioned particularly above, slowly accumulating phase errors are not particularly significant in the receiver detection process because the carrier recovery loop in the data demodulator of the associated receiver (not shown) can generally track out such errors.

Figure 2A:
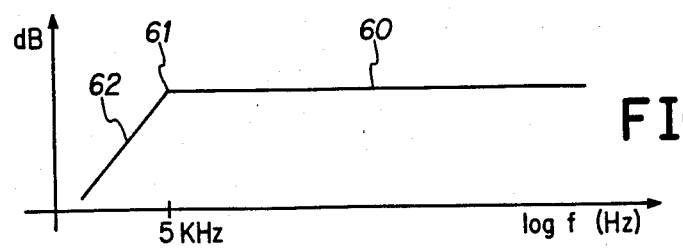
FIG. 2a is a graph of the frequency of phase modulations in an input signal to a carrier recovery loop of an exemplary receiver, versus decibels.

This is demonstrated in the frequency domain by the graph of FIG. 2a, which shows the response, and corresponding susceptibility, of the receiver to spurious phase modulation, that is, phase noise. It can be seen, for example, that above a frequency of 5,000 hertz, 100 percent of the phase changes occurring in the signal are detected, as occurring within the region of the flat line 60. Below 5,000 hertz, beginning from the break point 61, and decreasing at a slope of about 12 DB per octave along line 62, the susceptibility of the receiver to the phase changes decreases; thus, as mentioned, at low frequencies, the receiver is able to track changes in the frequency of the carrier, but at high frequencies, for example, above 5,000 hertz, the receiver is not able to distinguish the noise caused phase shift from data caused phase shifts. In addition to the foregoing, and in accordance with the invention, a phase error alarm amplifier 35 is provided to receive the output from the phase detector 12, via a series capacitor 36 and a resistor 37 connected to ground. The output from the phase error alarm amplifier 35 is conducted to respective positive and negative inputs of the phase error comparator circuits 40 and 41, by respective series capacitors 43 and 44. Additionally, a comparison voltage is developed to the respective negative and positive inputs of the phase error comparators 40 and 41 by a resistor voltage divider 50, as shown. The outputs of the phase error comparators 40 and 41 are connected to inputs of the quad OR gate 27. Thus, when the signal at the output of the phase OR gate 27. Thus, when the signal at the output of the phase error alarm amplifier 35 exceeds the predefined error signal producing criterion, as below described, the phase error comparators 40 and 41 will produce an output to provide an alarm indication at the output of the OR gate 32.

In operation, with respect to phase errors, after a short delay (approximately the reciprocal of the bandwidth of the loop), the phase-locked loop attempts to eliminate the phase errors and tends to make the duration of the worst part of the phase error relatively short. Thus, because of the relatively short duration of the phase error alarm, the monostable multivibrator 30 is provided to stretch the alarm duration to a human readable length, for example, on the order of 30 seconds, or more.

Figure 2B:
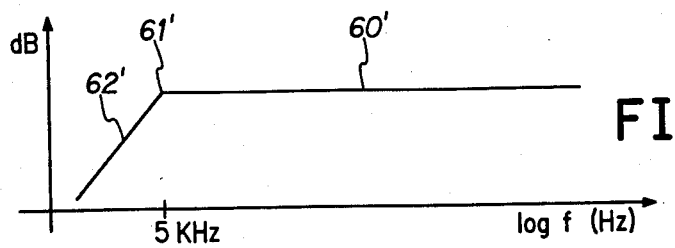
FIG. 2b is a graph of frequency versus decibels showing the frequency response of an alarm circuit, in accordance with the invention, with which a receiver having a frequency response similar to that of FIG. 2a is associated.

To achieve the error detection desired, in accordance with the invention, the frequency response of the alarm circuit 10 is designed to be the same or similar to the frequency response of the carrier recovery loop of the receiver. Thus, as shown in FIGS. 2a and 2b, the desired frequency response relationships of the alarm circuit and carrier recovery loop are shown, in an ideal comparison, in which the two are the same. (It should be noted that although ideally the two frequency responses should be identical, a reasonable approximation will suffice for most alarm purposes). In order to achieve the frequency response shown in FIG. 2b, the values of the capacitor 36 and resistor 37 are selected such that at low frequencies, the reactance of the capacitor 36 is high, to produce the initial ramp portion 62' beneath the knee 61'. The value of the resistor 37 is set to establish the input voltage to the phase error alarm amplifier 35 at higher frequencies, where the reactance of the capacitor 36 is essentially zero. The coupling capacitors 43 and 44 combined with the bias network resistors 50 also contribute a high pass characteristic similar to capacitor 36 and resistor 37. Between the two high pass networks, a slope of up to 12 DB per octave can be obtained. With the circuit as shown in FIG. 1, with the values of the capacitors 36, 43, and 44 and the resistors 36, 55 and 51 selected as above set forth, a frequency response similar to the frequency response of the receiver (FIG. 2a) can be achieved, as shown in FIG. 2b.

The sensitivity of the alarm circuit is controlled, in part, by the voltage offset applied to the phase error comparators 40 and 41 by the voltage divider provided by resistors 52, 53, and 54. Thus, if resistor 53 is made small in comparison to the larger resistor 52 and 54, the threshold of the respective phase error comparators 40 and 41 can be made very small to produce an alarm when the phase error amplifier 35 produces an output exceeding the threshold level.

By virtue of the fact that the frequency responses of the alarm detector and the receiver carrier recovery loop are the same or similar, the sensitivity of the alarm circuit parallels the susceptibility of the receiver to spurious phase modulation in the frequency source. Since the frequency response of the phase error alarm circuit is flat above about five thousand hertz (FIG. 2b), fast or rapidly occurring phase changes will be amplified a maximum amount, thus further assuring their detection, while errors occurring in the ramp region will be amplified a varying amount depending on its frequency.

As mentioned, the frequency response of the receiver detector carrier recovery loop has an initial ramp section 62 with a slope of approximately 12 db per octave, up to a frequency of about 5000 hertz. Above 5000 hertz, the receiver has essentially a flat line response 60. The frequency response described produces in a phase modulation receiver, a characteristic in which above 5000 cycles, errors in the phase of the source signal produce errors in the demodulated signal, but below 5000 hertz, the probability that an error will produce an error in the demodulated signal is reduced. Thus, by matching the frequency responses of the alarm circuit and the receiver, the occurrence of an error which may affect the accuracy of the detected signal can be identified with assurance.

In many instances, it is desired that the source alarm circuit sensitivity be very high. The realization of such high sensitivity yet still achieving the frequency response as set forth in FIG. 2a would require substantial gain in the source alarm circuit amplifier 35. Attaching more than one amplifier input, i.e., both the phase-locked loop amplifier and alarm circuit amplifier, to the relatively low level high impedance output of the phase detector in some cases may be also attended by problems. Thus, in some cases, it may be desirable to utilize the gain available in the source phase-locked loop amplifier 16 to at least partially provide the gain requirements of the alarm coupling circuit. Such circuit can be achieved in accordance with the invention from the circuit of FIG. 1 by deriving the input to the phase alarm amplifier from the output of the phase error amplifier and filter 16, rather than from its input (output connection not shown). Since, however, the frequency response of the phase-locked loop amplifier 16 does not match the receiver frequency response requirements for correct sensitivity of the alarm circuit, as shown in FIG. 2a, the frequency response of the alarm circuit with such connection must be redesigned.

Achieving the frequency response relationships as shown in FIGS. 2a and 2b in such cases is also complicated by the fact that the phase-locked loop amplifier 16 of the source has a non-flat frequency response, independently from the alarm circuit. A generalized typical frequency response for phase error amplifier, such as the amplifier 16 is set forth in FIG. 2c, including the dotted line portion. Such typical frequency response has an initial flat portion from zero to a break point 68T at about ten thousand hertz, a descending ramp to a break point 67T at about one hundred kilohertz, and a flat portion thereabove.

Figure 2C:
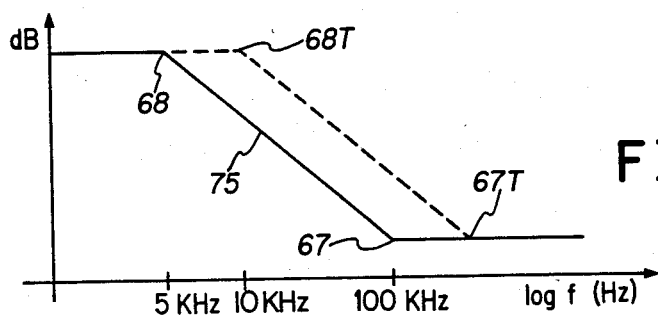
FIG. 2c is a graph of frequency versus decibels showing the frequency response of an amplifier in the signal source phase locked loop which is driven by a source phase detector.
Figure 2D:
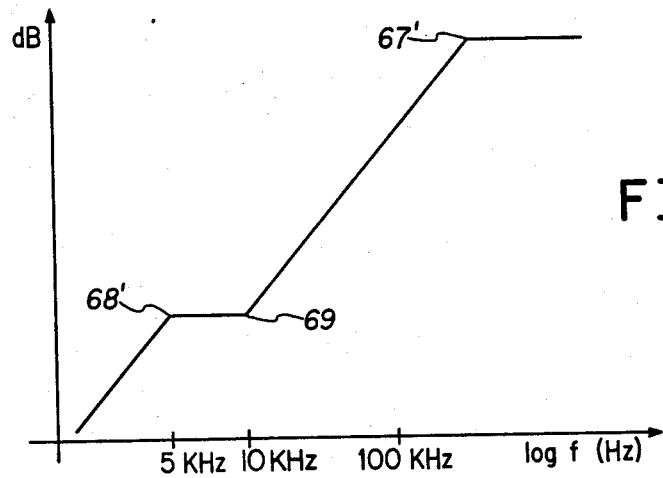
FIG. 2d is a graph of frequency versus decibels of a generalized frequency response of an alarm amplifier, using an output of the source phase locked loop amplifier.

With the phase error alarm amplifier 35 connected at the output of the phase error amplifier and filter 16, the general desired frequency response of the phase error alarm amplifier can be constructed to be approximately as shown in FIG. 2d. It should be noted with respect to the generalized frequency response curve of FIG. 2d, that the descending ramp portion between the break points 67' and 68' is at a rate of about 12 DB per octave, corresponding to the 12 DB per octave slope of the amplifier between the break point 68 and 67 shown in FIG. 2c. In the generalized curve, the response curve of FIG. 2d must contain a flattened portion between 68' and 69, corresponding to the difference between the 5 kilohertz break point 61 of the receiver curve (FIG. 2a) and the 10 kilohertz break point 68T of the phase error, denoted by the break point 69 in the curve of FIG. 2d.

Achieving the stepped response curve, however, of FIG. 2d requires careful hardware design considerations. It has been found that by designing the phase error amplifier to have a break point at 5 kilohertz, the same frequency as point 61 on FIG. 2a, showing the receiver sensitivity response, as shown by the solid line 75 in FIG. 2c, that a single declining curve 79 shown in the drawing of FIG. 2e can achieve the response curve of FIG. 2b for the alarm circuit, greatly simplifying the design requirements of the alarm circuit of the invention. It can therefore be seen that although the frequency response corner 61' in FIG. 2b is at the same frequency response corner 68 in FIG. 2c is not mandatory; it is a fortuitous design consideration to simplify the alarm circuit of the invention.

Figure 2E:
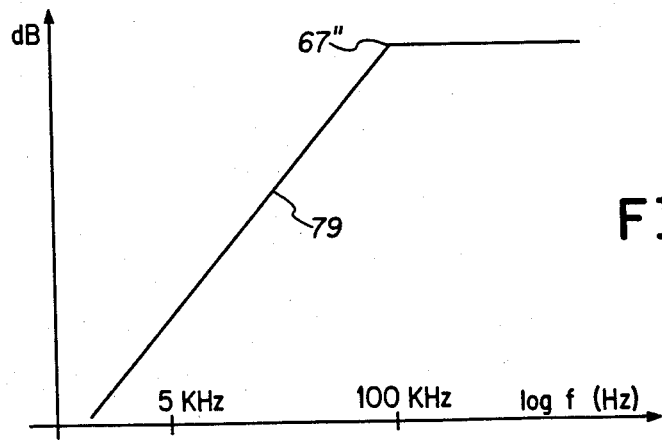
FIG. 2e is a graph of frequency versus decibels of a particular frequency response achieved with minimum hardware requirements by appropriate break point frequency selection in the design of the alarm amplifier circuit.

With a frequency response so configured, and with a phase alarm amplifier having a frequency response as shown in FIG. 2e cascaded therewith, a resulting gain shape as shown in FIG. 2b can be achieved. It would then be possible to disconnect the capacitor 36 from the phase detector 12 output and connect it to the phase error amplifier and filter 16 output (as shown by the dashed line 38 in FIG. 1) and realize the desired alarm gain and frequency response function while reducing the gain requirements on the phase error alarm amplifier 35.

Although the invention has been described and illustrated with a certain degree of particularity, it is understood that the present disclosure has been made by way of example only and the numerous changes in the combination or arrangement of parts may be resorted to by those skilled in the art without departing from the spirit and scope of the invention as hereinafter claimed.

I claim:

1. In a circuit for providing a source frequency for use in a radio, including a receiver having a detector with a known response to spurious phase modulation, the circuit having an alarm circuit to indicate that a source phase error exceeds a limit, the improvement comprising, means for making a frequency response of the alarm circuit similar to the spurious phase modulation response of the detector, whereby the alarm circuit indicates an error when the phase error of the source exceeds the spurious phase modulation response of the detector.

2. The improvement of claim 1 wherein the means for making the frequency response of the alarm circuit derives an input from an output of a phase detector.

3. The improvement of claim 1 wherein the means for making the frequency response of the alarm circuit derives an input from an output of a phase-locked loop amplifier.

4. A frequency source, for use in association with a phase sensitive receiver having a known response to spurious phase modulation, comprising:
   a reference oscillator,
   a voltage controlled oscillator (VCO),
   means for comparing an output of the reference oscillator with an output of said VCO to produce an output related to the phase difference therebetween,
   a phase error amplifier connected to produce a voltage correction signal to said VCO in response to said output of said comparing means, and
   an alarm circuit for producing an error signal when error events between the reference oscillator output phase and the VCO output are of a duration shorter than that for which the receiver can compensate due to its said phase modulation response.

5. The frequency source of claim 4 wherein said alarm circuit has a frequency response similar to a frequency response included in said associated receiver, whereby said alarm circuit does not initiate an alarm when an error event which would not be detected by said receiver occurs, and initiates an alarm when an error event occurs which would be detected by said receiver.

6. A frequency source, for use with an associated receiver having a known response in the frequency domain to spurious phase modulation, comprising:
   a phase-locked loop providing a source frequency, said phase-locked loop being operative to maintain the phase between first and second signals by controlling the frequency of one of said signals,
   and an alarm circuit operatively associated with said phase-locked loop to provide an error indication when the phase difference between said first and second signals varies at a higher frequency than said spurious phase modulation for which the receiver can compensate.

7. The frequency source of claim 6 wherein said alarm circuit comprises means, including an amplifier connected to receive the error signal, and including an impedance connected to said amplifier for providing a frequency response corresponding to a frequency response included in an associated receiver circuit,
   whereby said phase errors occurring in said frequency source which affect the ability of the receiver to properly demodulate the signal produce an error indication and said phase errors in said frequency source which do not affect the ability of the receiver to demodulate the signal do not produce an error indication.

* * * * *